United States Patent [19]

Epsom et al.

[11] Patent Number: 4,490,684
[45] Date of Patent: Dec. 25, 1984

[54] ADAPTIVE QUADRATURE COMBINING APPARATUS

[75] Inventors: Robert L. Epsom, Hanover Park; Paul H. Gailus, Chicago, both of Ill.

[73] Assignee: Motorola, Inc., Schaumburg, Ill.

[21] Appl. No.: 455,347

[22] Filed: Jan. 3, 1983

[51] Int. Cl.³ .............................................. H03F 1/32
[52] U.S. Cl. ................................. 330/149; 330/124 R; 328/163
[58] Field of Search ............... 330/149, 124 R, 295; 328/163; 455/50, 276, 295, 303, 304, 308, 311

[56] References Cited

U.S. PATENT DOCUMENTS

| | | | |
|---|---|---|---|
| 3,430,156 | 2/1969 | Katzin | 330/43 |
| 3,706,946 | 12/1972 | Bickford et al. | 332/23 |
| 3,735,266 | 5/1973 | Amitay | 179/15 BC X |
| 3,810,018 | 5/1974 | Stover | 178/67 X |
| 3,883,872 | 5/1975 | Fletcher et al. | 343/100 PE |
| 3,909,743 | 9/1975 | Margala et al. | 331/11 |
| 3,963,990 | 6/1976 | Difonzo | 328/166 X |
| 3,986,123 | 10/1976 | Tirro et al. | 343/200 X |
| 4,090,137 | 5/1978 | Soma et al. | 343/100 PE X |

OTHER PUBLICATIONS

Microwaves, Nov. 1978, vol. 17, No. 11, p. 97, Phase Loop Stabilizes Class-C Amplifiers.

*Primary Examiner*—James B. Mullins
*Attorney, Agent, or Firm*—Joseph T. Downey; Donald B. Southard; Edward M. Roney

[57] ABSTRACT

A quadrature combiner circuit is provided which employs a quadrature coupler to split an input radio frequency signal into split radio frequency signals which are amplified by respective amplifiers and recombined in a second quadrature coupler in such a manner as to minimize intermodulation distortion products. A feedback loop is employed to assure that the split amplified radio frequency signals incident upon the second quadrature combiner are maintained in quadrature relationship to assure intermodulation product cancellation.

7 Claims, 1 Drawing Figure

ADAPTIVE QUADRATURE COMBINING APPARATUS

BACKGROUND OF THE INVENTION

This invention relates to apparatus for the reduction of intermodulation distortion products generated by radio frequency transmitters and, more particularly to apparatus for reducing the intermodulation distortion products generated when the outputs of two radio frequency amplifiers are combined.

DESCRIPTION OF THE PRIOR ART

The efficiency of conventional radio frequency amplifiers decreases substantially as the frequency of the input signal increases. This trend continues to such an extent that at ultra-high frequencies such as 800 MHz, the power output of a particular radio frequency transmitter may be insufficient to meet the needs of a certain user. One way in which to meet the needs of such user is to appropriately couple the inputs of two radio frequency amplifiers together such that the amplifiers are driven from a common source. The output of such amplifiers are appropriately coupled together by means of a combiner, such as a hybrid coupler, which combines amplified signals from each amplifier and provides the combined signal created thereby to a common output. In this manner, higher transmitter output power is achieved. Unfortunately, this conventional radio frequency amplifier arrangement as well as uncombined amplifiers are prone to undesired intermodulation distortion products.

It is one object of the present invention to provide a radio frequency amplifier which optimally combines the output signals from two radio frequency amplifiers in a manner which minimizes intermodulation distortion products.

These and other objects of the invention will become apparent to those skilled in the art upon consideration of the following description of the invention.

BRIEF SUMMARY OF THE INVENTION

The present invention is directed to providing a radio frequency amplifier circuit which combines radio frequency signals applied to two amplifiers in such a manner as to minimize intermodulation distortion products.

In accordance with one embodiment of the invention, a circuit for combining radio frequency signals in a manner minimizing intermodulation distortion products includes a first quadrature coupler having a main input port, an isolation input port, a coupled output port and a feedthrough output port. The first quadrature coupler splits a radio frequency input signal into first and second signals exhibiting a quadrature relationship. Further, the first quadrature coupler provides such first and second signals to the coupled output port and the feedthrough output port of such first quadrature coupler, respectively. A first amplifier is electrically coupled to the coupled output port of the first quadrature coupler for amplifying a first signal. A second amplifier is electrically coupled to the feedthrough output port of the first quadrature coupler for amplifying the second signal.

The circuit further includes a second quadrature coupler having a coupled input port, a feedthrough input port, an isolation output port and a main output port. The second quadrature coupler combines signals provided to the coupled input port and the feedthrough input port of the second quadrature coupler. The feedthrough input port and the coupled input port of the second quadrature coupler are electrically coupled to the first and second amplifier, respectively. The circuit includes a phase detector having first and second inputs respectively coupled to the coupled input port and the isolation output port of the second quadrature coupler. The phase detector generates a phase detect signal exhibiting an amplitude porportional to the phase difference of the signal at the coupled input port and the isolation output port of the second quadrature coupler.

A voltage variable attenuator is operatively electrically coupled from the main input port and to the isolation input port of the first quadrature coupler and, through an integrator, to the phase detector. The voltage variable attenuator provides a selected resistance proportional to the integral of the phase detect signal such that the differential phase of signals provided to the coupled input port and the feedthrough input port of the second quadrature combiner is appropriately adjusted to a value which causes the phase detect signal to be driven substantially to zero.

Thus, signals provided to the feedthrough input port and the coupled input port of said second quadrature coupler are maintained substantially in quadrature relationship with respect to each other such that intermodulation products are substantially reduced.

The features of the invention believed to be novel are set forth with particularity in the appended claims. The invention itself, however, both as to organization and method of operation, together with further objects and advantages thereof, may thus be understood by reference to the following description taken in conjunction with the accompanying drawing.

DETAILED DESCRIPTION OF THE PREFERRED EMBODIMENT

Figure 1:
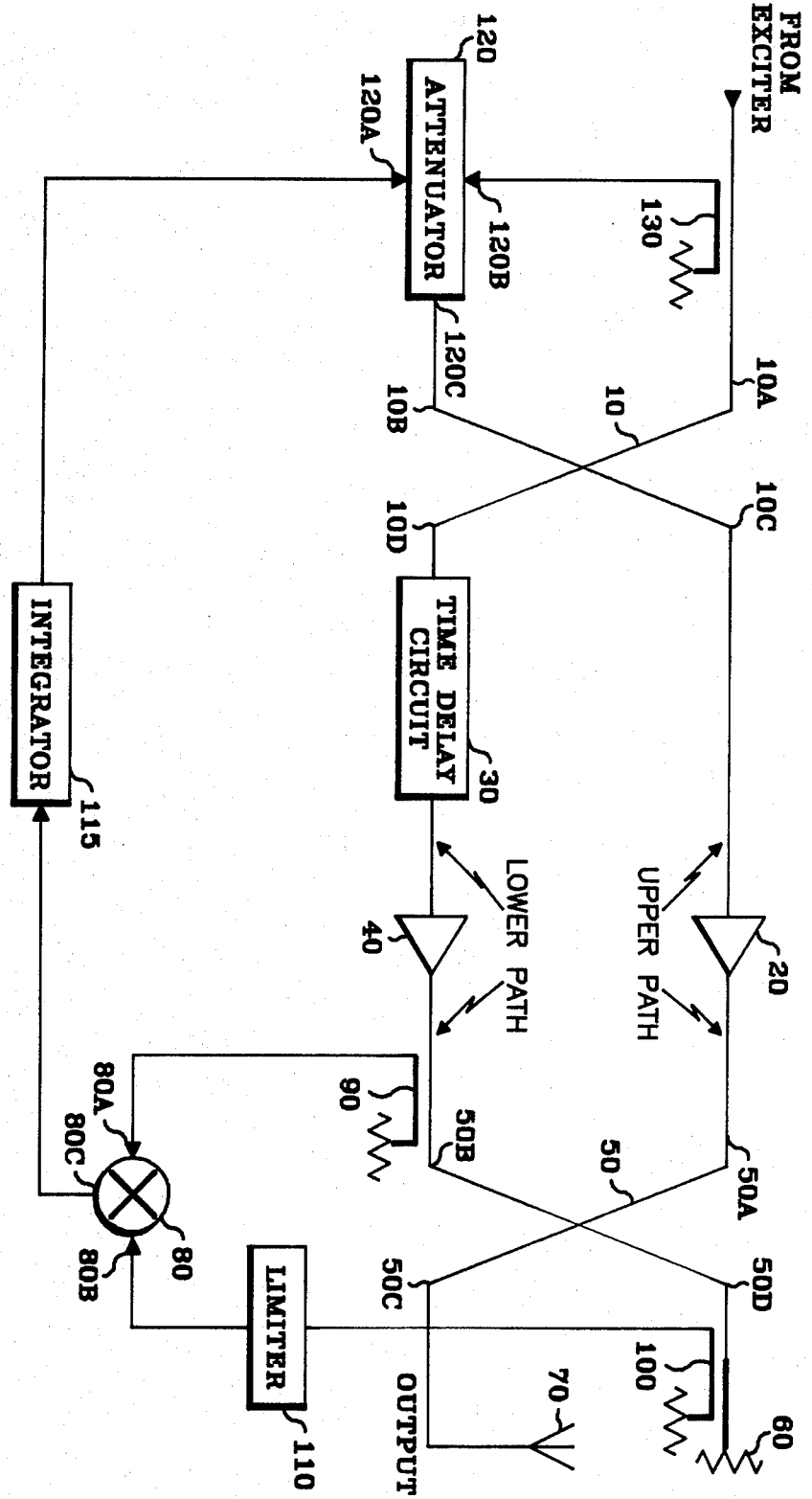
FIG. 1 is a block diagram of the adaptive quadrature combining apparatus of the present invention.

FIG. 1 illustrates one embodiment of the combining circuit of the present invention. The combining circuit of FIG. 1 includes a quadrature coupler 10 having a main input port 10A, an isolation input port 10B, a coupled output port 10C and a feedthrough output port 10D. In this embodiment of the invention, a 3db quadrature coupler is employed as coupler 10. Main input 10A is coupled to the output of an exciter (not shown) which provides a source of radio frequency signals to be amplified by the circuit of the present invention.

The radio frequency signals thus supplied to quadrature coupler 10 are split between coupled output port 10C and feedthrough output port 10D. The portion of the input radio frequency signal reaching coupled output port 10C exhibits half the power and the same phase as the radio frequency input signal provided to main input 10A.

The portion of the input radio frequency signal reaching feedthrough output port 10D exhibits a power equal to half the power of the input signal provided to input port 10A. However, due to the quadrature nature of coupler 10, the portion of the radio frequency input signal reaching feedthrough output port 10D exhibits a phase 90° out of phase with the input signal at main input port 10A.

Coupled output port 10D is coupled to the input of a radio frequency amplifier 40 via a time delay circuit 30 coupled therebetween as shown in FIG. 1. For radio frequency input signals having a frequency of 850 MHz, time delay circuit 30 exhibits a time delay of 98 picoseconds which causes signals passing therethrough to be delayed by such time. The time delay selected for delay circuit 30 is a function of the frequency of the input signals, that is the operating frequency, and the dynamic range of phase over which the adaptive quadrature combining apparatus of the present invention is to adapt. The equation for such time delay is:

$$\text{TIME DELAY} = \frac{1 \times \text{PHASE DYNAMIC RANGE}}{360 \times \text{FREQUENCY}}$$

Thus in the present embodiment of the invention wherein the input frequency is 850 MHz, when a dynamic range of phase at 60° is selected, the time delay of delay circuit 30 is 98 pico-seconds. Feedthrough output port 10D is coupled to the input of a radio frequency amplifier 40. Radio frequency amplifiers operating in class C mode are employed as amplifiers 20 and 40.

As seen in FIG. 1, the combiner circuit includes a second quadrature coupler 50 having a feedthrough input port 50A, a coupled input port 50B, a main output port 50C and an isolation port 50D. A 3 db quadrature coupler may be employed as coupler 50. Feedthrough input port 50A and coupled input port 50B are coupled to the outputs of amplifier 20 and amplifier 40, respectively. Thus, an amplified version of the radio frequency input signal is applied to feedthrough input port 50A. In a similar manner, an amplified version of the radio frequency input signal is applied to coupled input 50B. However, such amplified signal applied to input port 50B is in quadrature with, that is 90° out of phase with, the radio frequency input signal applied to main input port 10A.

Isolation output port 50D is coupled to a termination resistor 60 exhibiting the appropriate termination resistance of the particular combiner circuit, for example 50 ohms. Quadrature coupler 50 is thus properly terminated. Main output port 50C is coupled to an antenna 70 such that the combined output of amplifiers 20 and 40 is applied to antenna 70.

The combiner circuit of FIG. 1 further includes a mixer 80 having inputs 80A and 80B which are coupled to coupled input port 50B and isolation output port 50D via couplers 90 and 100, respectively. A limiter circuit 110 is coupled between mixer input 80B and coupler 100 to maintain the amplitude of signals from coupler 100 incident upon mixer input 80B at a constant amplitude. Limiter 110 and mixer 80 cooperate to act as a phase detector which generates a phase detect signal at mixer output 80C. The phase detect signal exhibits an amplitude proportional to the phase difference of the signal at coupled input port 50B and isolation output port 50D of quadrature coupler 50.

Mixer output 80C is coupled to the input of an integrator circuit 115 which integrates the phase detect signal from mixer 80. The output of integrator 115 is coupled to an input 120A of a electrically variable attenuator circuit 120 which includes inputs 120A and 120B and an output 120C. Input 120B is coupled to main input port 10A of quadrature coupler 10 via a coupler 130 as shown in FIG. 1. Coupler 130 couples a portion of the radio frequency input signal at port 10A to variable attenuator 120 which attenuates such radio frequency signals to an extent determined by the DC voltage level of the filtered phase detect signal provided to attenuator input 120A. An attenuated radio frequency input signal is generated at attenuator output 120C and provided to isolation input 10B of quadrature coupler 10. As seen in FIG. 1, amplifiers 20 and 40 provide signal paths designated as an upper path and a lower path, respectively. Attenuator 120 and quadrature coupler 10 cooperate to form a phase shifter which selectively adjusts the differential phase between the upper signal path and lower signal path in a manner proportional to the amount of attenuation provided by variable attenuator 120. This selectively variable phase shift is achieved in the following manner.

The attenuator output signal provided to port 10B is split by quadrature coupler 10 into two signals of equal power, one of which is present at port 10C and the other at port 10D. The signal generated at port 10C due to the signal entering port 10B lags by 90° the signal generated at port 10C due to the signal entering port 10A. Correspondingly, the signal generated at port 10D due to the signal entering port 10B leads by 90° the signal generated at port 10D due to the signal entering port 10A. The effect of such additional signals at ports 10C and 10D is to decrease the phase shift of the signal present at port 10C and increase the phase shift of the signal at port 10D from the values of such signals due to the signal at port 10A alone. The differential phase shift thereby produced between signals exiting ports 10C and 10D is thus proportional to the signal level entering port 10B, and hence is also proportional to the signal provided to attenuator input 120A.

Time delay circuit 30 exhibits a time delay of 98 picoseconds in this embodiment of the invention such that the phase shifter formed by attenuator 120 and coupler 10 is enabled to adjust the differential phase between the upper signal path and the lower signal path from an amount less than quadrature to an amount greater than quadrature.

In summary, the combiner circuit of FIG. 1 operates in the following manner. A radio frequency input signal from an exciter is provided to main input port 10A of coupler 10 at which such input signal is split between an upper path, subject to the time delay provided by time delay circuit 30, and a lower path. The split radio frequency signals thus generated are amplified by amplifier 20 and amplifier 30 in the upper and lower paths, respectively. After such amplification the amplified split signals which exhibit a quadrature relationship with respect to each other due to circuit action subsequently discussed, are combined at quadrature coupler 50 and provided output at main output port 50C.

It is essential that the split amplified radio frequency signals reaching feedthrough input port 50A and coupled input port 50B are maintained substantially in quadrature relationship such that the combined desired signal output is maximized at main output port 50C and any intermodulation products are substantially cancelled at main output port 50C. To assure that these conditions occur, the phase difference existing between signals at coupled input port 50B and isolation output port 50D is determined by the phase detector formed by mixer 80 and limiter 110. This phase difference appears as the phase detect signal at mixer output 80C and is driven to zero by applying the filtered phase detect signal to variable attenuator 120 which according to the particular value of the phase detect signal provides an appropriate impedance to attenuate signals passing therethrough and to shift the phase of signals passing through coupler 10 by an amount sufficient to maintain a quadrature relationship between the split amplified radio frequency signals provided to feedthrough input port 50A and coupled input port 50B of quadrature coupler 50. By maintaining such quadrature relationship between such split amplified radio frequency signals, intermodulation products at main output port 50C are minimized while the amplitude of the recombined split amplified radio frequency signal generated thereat is maximized.

The foregoing describes a radio frequency combining circuit which splits a signal received from an exciter into two signals which are amplified and recombined in such a manner that intermodulation distortion products are substantially reduced.

While only certain preferred features of the invention have been shown by way of illustrations, many modifications and changes will occur to those skilled in the art. It is, therefore, to be understood that the present claims are intended to cover all such modifications and changes as fall within the true spirit of the invention.

What is claimed is:

1. A circuit for combining radio frequency signals in a manner minimizing intermodulation distortion products comprising:

first quadrature coupler means, having a main input port, an isolation input port, coupled output port and a feedthrough output port, for spliting a radio frequency input signal into first and second signals exhibiting a quadrature relationship and for providing said first and second signals to said coupled output port and said feedthrough output port, respectively;

first amplifying means, electrically coupled to the coupled output port of said first quadrature coupler means, for amplying said first signal;

second amplifying means, electrically coupled to the feedthrough output port of said first quadrature coupler means, for amplifying said second signal;

second quadrature coupler means, having a coupled input port, a feedthrough input port, an isolation output port, and a main output port, for combining signals provided to the coupled input port and the feedthrough input port of said second quadrature coupler means, said feedthrough input port and said coupled input port of said second quadrature coupler means being electrically coupled to said first and second amplifying means, respectively;

phase detector means, having first and second inputs respectively coupled to the coupled input port and the isolation output port of said second quadrature coupler means, for generating a phase detect signal exhibiting an amplitude proportional to the phase difference of signals at the coupled input port and the isolation output port of said second quadrature coupler means, and voltage variable attenuator means, operatively electrically coupled to the main input port and isolation input port of said first quadrature coupler means and to said phase detector means, for providing a selected resistance proportional to said phase detect signal such that the differential phase of signals provided to the coupled input port and the feedthrough input port of said second quadrature combining means is appropriately adjusted to a value which causes the phase detect signal to be driven substantially to zero, whereby signals provided to the feedthrough input port and the coupled input port of said second quadrature coupler means are maintained substantially in quadrature relationship with respect to each other such that intermodulation products are substantially reduced.

2. The circuit of claim 1 wherein said phase detector comprises a mixer having first and second inputs and an output.

3. The circuit of claim 2 including limiting means, electrically coupled between the isolation port of said second quadrature combining means and the second input of said mixer, for preventing the amplitude of signals passing through said limiting means from exceeding a predetermined level.

4. The circuit of claim 1 including an integrator means, electrically coupled between said phase detector means and said voltage variable attenuator means, for integrating said phase detect signal.

5. A circuit for combining radio frequency signals in a manner minimizing intermodulation distortion products comprising:

first quadrature coupler means, having a main input port, an isolation input port, coupled output port and a feedthrough output port, for spliting a radio frequency input signal into first and second signals exhibiting a quadrature relationship and for providing said first and second signals to said coupled output port and said feedthrough output port, respectively;

first amplifying means, electrically coupled to the coupled output port of said first quadrature coupler means, for amplying said first signal;

second amplifying means, electrically coupled to the feedthrough output port of said first quadrature coupler means, for amplifying said second signal;

second quadrature coupler means, having a coupled input port, a feedthrough input port, an isolation output port, and a main output port, for combining signals provided to the coupled input port and the feedthrough input port of said second quadrature coupler means, said feedthrough input port and said coupled input port of said second quadrature coupler means being electrically coupled to said first and second amplifying means, respectively;

phase detector means, having first and second inputs respectively coupled to the coupled input port and the isolation output port of said second quadrature coupler means, for generating a phase detect signal exhibiting an amplitude proportional to the phase difference of signals at the coupled input port and the isolation output port of said second quadrature coupler means;

integrator means, operatively electrically coupled to the output of said phase detector means, for integrating said phase detect signal, and voltage variable attenuator means, operatively electrically coupled to the main input port and isolation input port of said first quadrature coupler means and to the output of said integrator means, for providing a selected resistance proportional to the integral of said phase detect signal such that the differential phase of signals provided to the coupled input port and the feedthrough input port of said second quadrature combining means is appropriately adjusted to a value which causes the phase detect signal to be driven substantially to zero, whereby signals provided to the feedthrough input port and the coupled input port of said second quadrature coupler means are maintained substantially in quadrature relationship with respect to each other such that intermodulation products are substantially reduced.

6. The circuit of claim 5 wherein said phase detector comprises a mixer having first and second inputs and an output.

7. The circuit of claim 5 including limiting means, electrically coupled between the isolation port of said second quadrature combining means and the second input of said mixer, for preventing the amplitude of signals passing through said limiting means from exceeding a predetermined level.

* * * * *